United States Patent [19]

Wright

[11] Patent Number: 4,837,523

[45] Date of Patent: Jun. 6, 1989

[54] HIGH SLEW RATE LINEAR AMPLIFIER

[75] Inventor: John W. Wright, Los Altos, Calif.

[73] Assignee: Elantec, Milpitas, Calif.

[21] Appl. No.: 177,495

[22] Filed: Apr. 4, 1988

[51] Int. Cl.$^4$ .......................... H03F 3/45; H03F 3/26
[52] U.S. Cl. ...................................... 330/255; 330/267
[58] Field of Search ............... 330/252, 255, 257, 263, 330/267, 268, 311

[56] References Cited

U.S. PATENT DOCUMENTS

| | | | |
|---|---|---|---|
| 3,434,069 | 3/1969 | Jones | 330/30 |
| 3,493,881 | 2/1970 | Zuch | 330/24 |
| 3,638,132 | 1/1972 | Trilling | 330/69 |
| 3,668,543 | 6/1972 | Balley | 330/30 |
| 3,769,605 | 10/1973 | Long | 330/51 |
| 3,868,583 | 2/1975 | Krabbe | 330/30 |
| 4,147,944 | 4/1979 | Monticelli | 307/362 |
| 4,157,493 | 6/1979 | Monticelli | 323/9 |
| 4,163,908 | 8/1979 | Price | 330/255 X |
| 4,481,481 | 11/1984 | Sleeth et al. | 330/296 |
| 4,570,128 | 2/1986 | Monticelli | 330/267 |
| 4,701,720 | 10/1987 | Monticelli | 330/260 |

Primary Examiner—Steven Mottola
Attorney, Agent, or Firm—A. C. Smith

[57] ABSTRACT

An improved linear amplifier circuit includes controlled current sources connected to supply additional current to the output stage during rapid change of applied signal. The current sources are responsive to current levels in the input stages and thus need only conduct low levels of current during quiescent operating conditions. Symmetrical and asymmetrical circuit configurations with respect to reference potential are disclosed.

6 Claims, 4 Drawing Sheets

HIGH SLEW RATE LINEAR AMPLIFIER

BACKGROUND OF THE INVENTION

1. Field of Invention

This invention relates to buffer amplifiers and more particularly to an amplifier which is capable of changing output current level rapidly without need for high levels of quiescent current.

Conventional DC-coupled linear amplifiers commonly use push-pull output stages that alternate between on and off conduction conditions on applied signals of opposite polarity. Thus, during positive rise of output current, one output stage is heavily conductive and another output stage is tending toward non-conduction. The conditions reverse on negative rise of output current. For high rates of change, the drive current to the heavily conductive output stage may not be sufficient to keep up with the load requirement and output signal distortion results. One technique used to overcome this condition included increasing the quiescent current level in the output stages to assure that ample current is available during rapid changes. However, this technique has the disadvantage of requiring substantial levels of idle current from the power supply with concomitant higher power dissipation, and higher junction temperatures which may require heat sinks.

SUMMARY OF THE INVENTION

In accordance with the present invention, output stages are supplied from current sources that are slaved to diodes in current mirror configurations and that conduct the full quiescent current during rapid signal changes. The output stages that are supplied by such current sources are thus able to follow rapid signal changes occurring at the driving-point circuit node. The circuitry may be symmetrically configured about reference potential, or ground, or may be configured in single-channel configuration with respect to such reference potential.

DESCRIPTION OF THE PREFERRED EMBODIMENT

Figure 1:
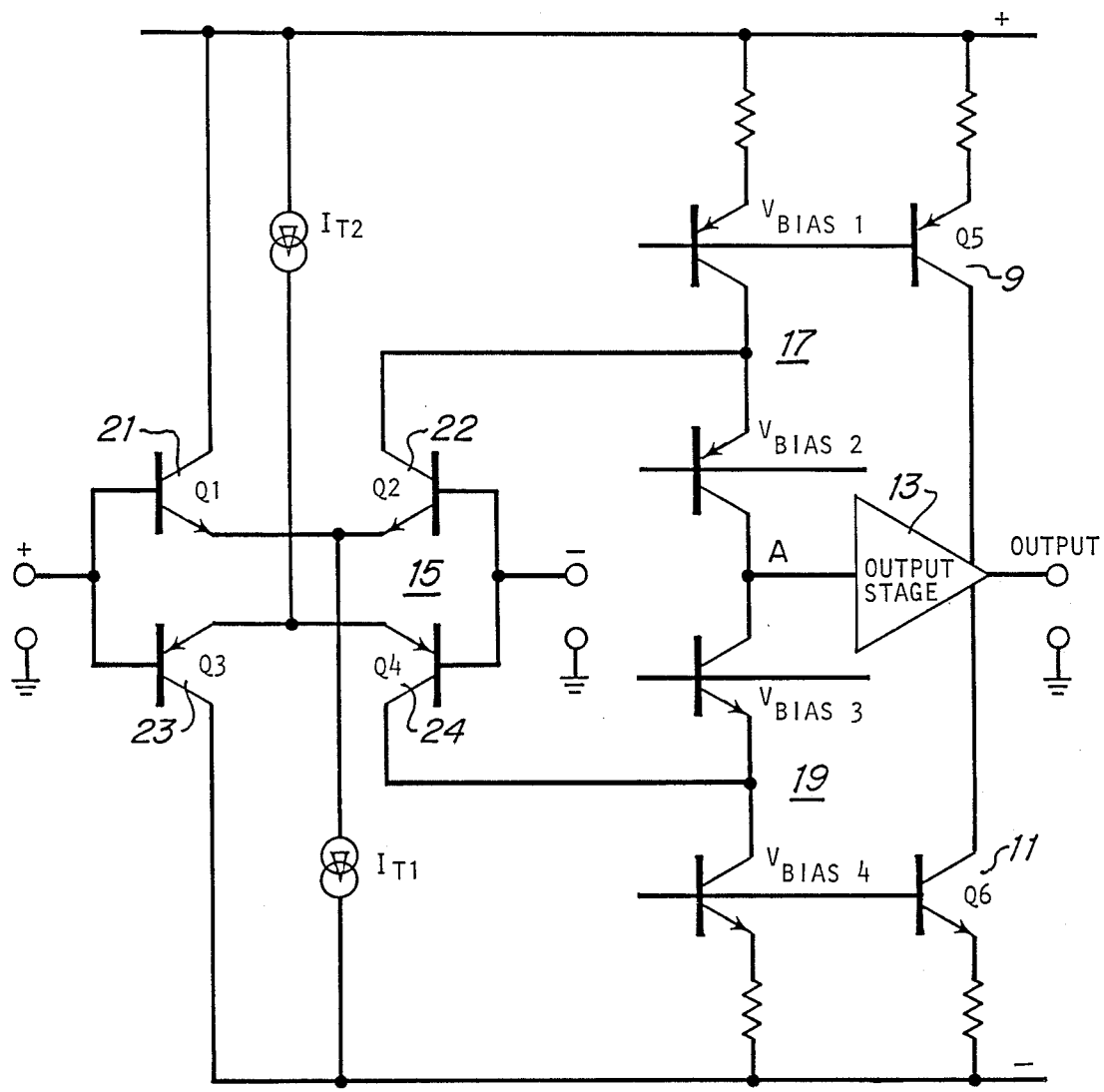
FIG. 1 is a schematic diagram of a conventional linear amplifier.

Referring now to FIG. 1, there is shown a schematic diagram of a conventional linear amplifier in which current sources 9, 11 supply the output stage 13 with quiescent current, and such current sources are controlled from bias Voltages, Vbias 1 and Vbias 2 and Vbias 3 and Vbias 4. Intermediate gain stages 17, 19 are coupled to the input stage to drive the node A of the output stage 13. On fast positive slew rates, the transistors 21 and 24 are on and transistors 22 and 23 are off. This causes the signal on node A to increase rapidly and the output stage 13 cannot follow the signal change with resulting output signal distortion. One known solution for this problem is to increase the quiescent current through the current sources 9 and 11 to assure adequate current in output stage 13 to enable the output thereof to follow the signal changes at node A. Internal capacitance that must be charged on fast signal changes, and other factors, contribute to the requirement for undesirably high levels of quiescent current in the output stage 13.

Figure 2:
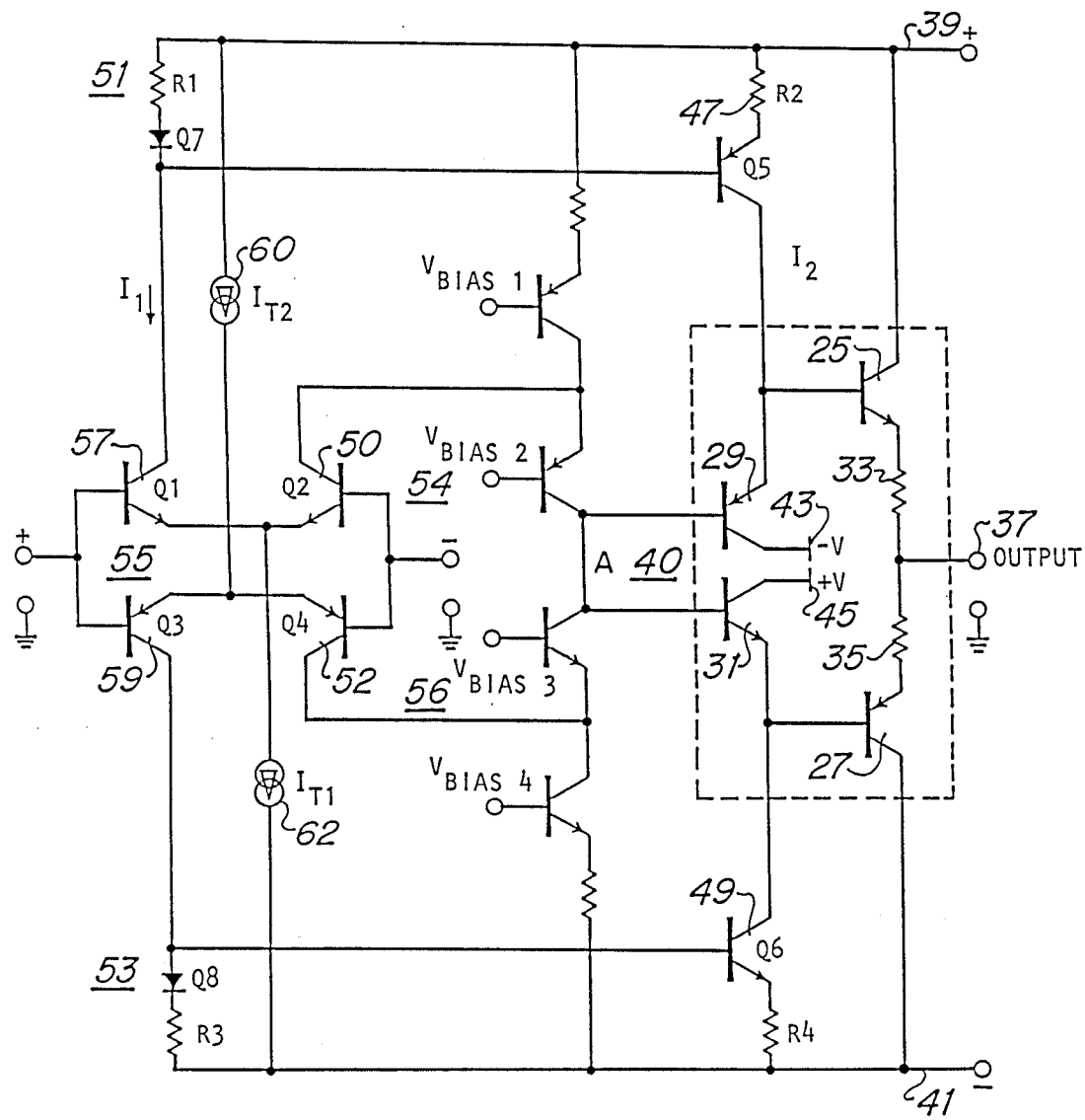
FIG. 2 is a schematic diagram of a linear amplifier according to one embodiment of the present invention.

Referring now to FIG. 2, there is shown a schematic diagram of one embodiment of the present invention in which the output stage 40 includes a pair of complementary conductivity-type transistors 25, 27 and a pair of complementary conductivity-type driver transistors 29, 31 with emitters coupled to the bases of the respective output transistors 25, 27. A pair of serially-connected resistors 33, 35 are connected between the emitters of the output transistors 25, 27 to provide the output node 37 at the junction of the two resistors 33, 35. The collectors of the output transistors 25, 27 are connected to receive bias current from the power supply conductors 39, 41.

The collectors of the driver transistors 29, 31 are connected to power supply conductors 43 and 45, and the emitters of these transistors are connected to the collectors of complementary conductivity-type transistors 47, 49. The bases of these latter transistors 47, 49 are coupled to diodes and resistors 51, 53 in current-mirror circuit configurations within the collector circuits of the input transistors 57, 59. These latter transistors are coupled through the pair of transistors 50, 52 that form the inverting input of the input stage 55, and through the intermediate gain stages 54, 56 to the input node A. Current sources 60, 62 are cross coupled between the power supply conductors 39, 41 and the pair of common emitter transistors that form the inverting and non-inverting inputs of the input stge 55.

In operation, transistors 47 and 49 operate as controlled current sources in current-mirror configurations with diodes and resistor 51 and 53 to supply current to the driver transistors 29, 31 in proportion to the current in the collector circuit of input transistors 57 and 59. The current sources 47 and 49 thus supply full current to driver transistors 29, 31 during fast slew on applied signal in response to the increased collector currents in the input transistors 57, 59 on such applied signal. This increase in current through transistors 47 and 49 allows the output stage 40 to follow fast signal transitions at node A without requiring high quiescent current in idle condition. In addition, emitter degeneration in these current-mirror configurations of transistors 47 and 49 can be used to increase the available current. The IR drop $I_1 R_1$ will be equal $I_2 \times R_2$, but if $R_1$ is larger than $R_2$ then $I_2$ will have to be larger than $I_1$ for the equality to hold, and $I_2$ is therefore bigger than $I_1$. Thus, the transistors 47 and 49 can idle at much lower quiescent current levels than transistors 9, 11 in the circuit of FIG. 1 and still follow rapid slew rates at node A.

Figure 3:
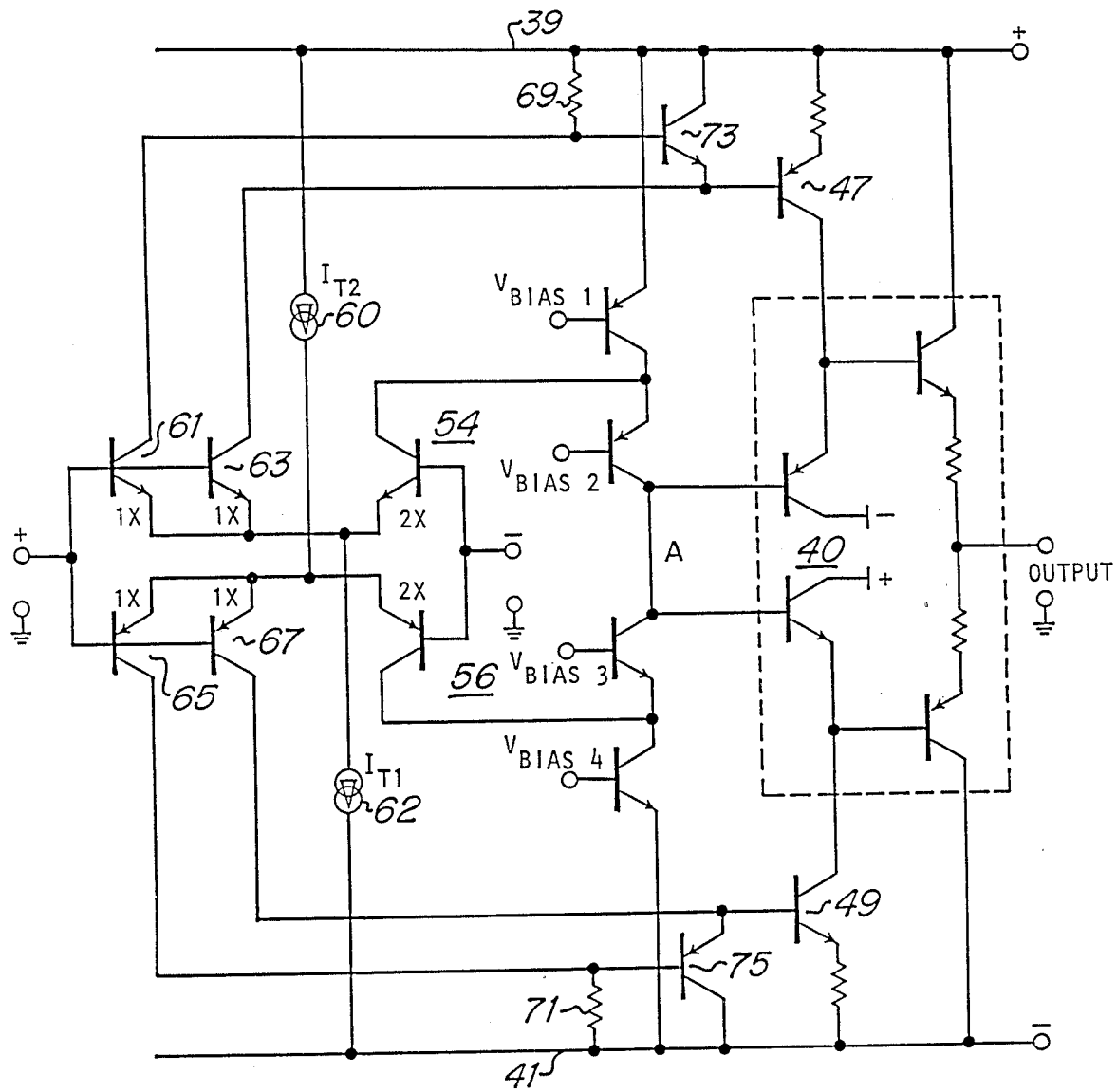
FIG. 3 is a schematic diagram of another embodiment of the present invention.

Referring now to FIG. 3, there is shown another embodiment of the present invention in which the input transistors in each channel are split as two transistors 61, 63 and 65, 67 having common emitters and common bases and having separate collector circuits that are connected to control the current sources 47, 49. Specifically, the collector current in one of the input transistors 61, 65 is supplied from the power supply conductors 39, 41 through a resistor 69, 71. An intermediate stage including transistor 73, 75 is connected in common collector configuration in order to supply current to the respective second ones of the input transistors 63, 67. Similar intermediate stages 54, 56, including the pair of transistors that form the inverting input of the input stage, couple the input transistors to the node A at the input of the output stage 40. This circuit configuration assures that the collector current in the input stage, as it responds to applied signal, is proportionally mirrored in the current supplied to the output stage 40 when additional current is needed during rapid slew rate. Under slow signal change or idle conditions, only low quiescent currents required in the output stage 40, and this contributes to lower average power dissipation in the circuit of the present invention relative to the average power dissipation in conventional circuits requiring higher quiescent current level in the output stage.

Figure 4:
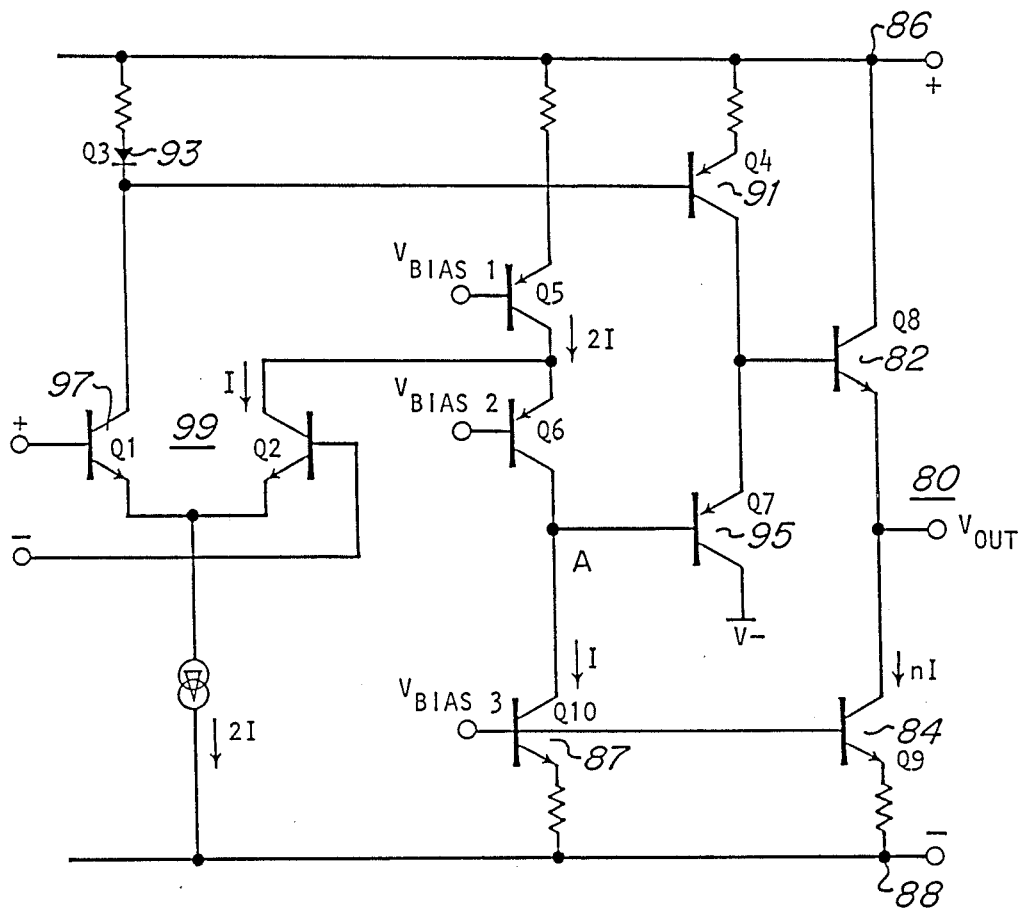
FIG. 4 is a schematic diagram of another embodiment of the present invention including single-channel asymmetrical circuit configuration.

In single-channel configuration, the circuitry of the present invention may be simplified as illustrated in FIG. 4. In this embodiment, the output stage 80 includes same conductivity type transistors 82, 84 connected between bias supply voltages 86, 88 to operate Class A in a single-ended version of the embodiment illustrated in FIG. 2. The current mirror circuit including transistor 91 and diode 93 provides controlled current to transistor 95 of opposite conductivity type in response to current in the transistor 97 of the differential input pair 99. During rapid positive slew rates at node A, the increased controlled current from transistor 91 prevents transistor 95 from cutting off. Transistor 82 is thus supplied with ample current to follow the rapid positive slew without significant distortion.

During rapid negative slew rates at node A the transistor 95 of opposite conductivity type relative to the output transistor 82 is readily capable of supplying requisite base current to transistor 82 in response to the slew rate at node A without significant distortion.

The transistor 84 of same conductivity type as output transistor 82 is quiescently biased at a ratio of the current in transistor 87 in order to prevent transistor 82 from cutting off during negative slew in node A. Of course, the circuit illustrated in FIG. 4 may be constructed using transistors of opposite conductivity types relative to the types illustrated, and the above descriptions of operation on negative and positive slew rates at node A will be transposed.

I claim:

1. An amplifier circuit for operation at reduced quiescent current levels having double-ended input and single-ended output, the circuit comprising:
   an output stage having a pair of transistors with collectors and emitters serially connected to receive bias signal;
   a driver transistor coupled to supply signal to one of the transistors of the output stage;
   means coupling an input stage to supply signal at the output thereof to said driver transistor;
   source means connected to supply current of controllable level to the driver transistor; and
   circuit means coupled to the input stage for supplying control signal to the source means for controlling the level of current supplied thereby to the driver transistor in response to signal level in the input stage.

2. An amplifier circuit for operation at reduced quiescent current levels and having complementary symmetrical signal channels from double-ended input stage to single-ended output stage, the circuit comprising:
   bias means for supplying bias signals of opposite polarity on separate conductors;
   an output stage having a first pair of complementary conductivity type transistors;
   a second pair of complementary conductivity type transistors in the output stage coupled to drive respective ones of said first pair of transistors;
   an input stage including at least one pair of transistors coupled to receive applied signal;
   source means connected to supply current of controllable level to the second pair of transistors in the output stage;
   means coupling the output of the input stage to drive said second pair of transistors in the output stage; and
   circuit means connected to the transistors in the input stage for supplying control signals to the source means to control the level of current supplied thereby to said second pair of transistors in response to signal level in the input stage.

3. An amplifier circuit as in claim 2 wherein said circuit means includes a diode and resistor serially connected between the one of the conductors of the bias supply and a transistor of the input stage for supplying the control signal to the source means in response to the current in said resistor and diode.

4. An amplifier circuit as in claim 3 wherein said resistor and diode and said source means are connected in a current mirror configuration to maintain selected proportionality between current in an input transistor in the input stage and the current supplied by the corresponding source means.

5. An amplifier circuit for operation at reduced quiescent current levels and having complementary symmetrical signal channels from double-ended input stage to single-ended output stage, the circuit comprising:
   bias means for supplying bias signals of opposite polarity on separate conductors;
   an output stage having a first pair of complementary conductivity type transistors;
   a second pair of complementary conductivity type transistors in the output stage coupled to drive respective ones of said first pair of transistors;
   an input stage including at least one pair of transistors coupled to receive applied signal; said transistors in the input stage including in each channel a pair of transistors of the same conductivity type having emitter and base electrodes commonly connected and having collector electrodes;
   a resistor connecting one of said collector electrodes and a conductor of said bias means; and
   source means connected to supply current of controllable level to the second pair of transistors in the output stage;
   means coupling the output of the input stage to drive said second pair of transistors in the output stage; and
   circuit means connected to the transistors in the input stage for supplying control signals to the source means in response to the level of current in the input stage;
   said circuit means including an auxiliary transistor of said same conductivity type coupled to receive the signal across said resistor and connected between the conductor of the bias means and another of said collector electrodes for supplying a control signal on said another collector electrode to the source means.

6. Differential amplifier circuit for operation at reduced quiescent current levels, the circuit comprising:

an output stage having a transistor coupled to receive bias current and an applied signal;

an input stage including at least one pair of transistors coupled to form inverting and non-inverting inputs for receiving applied signals thereon;

source means connected to supply bias current of controllable level to the transistor in the output stage;

means coupling the pair of transistors in the input stage to supply signal to the transistor in the output stage; and circuit means connected to the input stage for supplying control signals to the source means for increasing the level of bias current supplied thereby to the transistor in the output stage in response to an increased signal level in the input stage.

* * * * *